(12) United States Patent
Yoon

(10) Patent No.: US 12,294,389 B2
(45) Date of Patent: May 6, 2025

(54) SEMICONDUCTOR DEVICE

(71) Applicant: SAMSUNG ELECTRONICS CO., LTD., Suwon-si (KR)

(72) Inventor: Young Hyun Yoon, Gwangmyeong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 266 days.

(21) Appl. No.: 18/148,604

(22) Filed: Dec. 30, 2022

(65) Prior Publication Data

US 2023/0231572 A1 Jul. 20, 2023

(30) Foreign Application Priority Data

Jan. 19, 2022 (KR) ................ 10-2022-0007881
May 10, 2022 (KR) ................ 10-2022-0057004

(51) Int. Cl.
*H03M 1/00* (2006.01)
*H03K 19/20* (2006.01)
*H03M 3/00* (2006.01)

(52) U.S. Cl.
CPC ............ *H03M 3/502* (2013.01); *H03K 19/20* (2013.01); *H03M 3/422* (2013.01); *H03M 3/464* (2013.01)

(58) Field of Classification Search
CPC ...... H03M 3/502; H03M 3/422; H03M 3/464; H03K 19/20
See application file for complete search history.

(56) References Cited

U.S. PATENT DOCUMENTS

| | | | |
|---|---|---|---|
| 5,990,819 A | 11/1999 | Fujimori | |
| 6,147,522 A * | 11/2000 | Rhode | H03M 3/368 |
| | | | 327/93 |
| 6,304,608 B1 * | 10/2001 | Chen | H03M 3/35 |
| | | | 375/252 |
| 7,176,817 B2 | 2/2007 | Jensen | |
| 7,567,193 B2 | 7/2009 | Ryu | |
| 7,852,248 B1 | 12/2010 | Keramat et al. | |
| 9,450,600 B2 | 9/2016 | Chubachi et al. | |
| 10,491,237 B1 | 11/2019 | Kim et al. | |
| 2012/0326905 A1 * | 12/2012 | Nezuka | H03M 3/464 |
| | | | 341/143 |
| 2017/0077938 A1 * | 3/2017 | Heubi | H03M 1/08 |
| 2020/0343904 A1 | 10/2020 | Ganta et al. | |
| 2020/0343905 A1 * | 10/2020 | Shu | H03M 3/458 |
| 2022/0149864 A1 * | 5/2022 | Prakash | H03M 3/458 |

* cited by examiner

*Primary Examiner* — Jean B Jeanglaude
(74) *Attorney, Agent, or Firm* — MORGAN, LEWIS & BOCKIUS LLP

(57) ABSTRACT

A semiconductor device such as a sigma delta A/D converter includes an integrator configured to output first and second output signals, a quantizer configured to generate a first digital signal based on the output signals, first and second switches configured to control application of first and second reference voltages to a first resistor based on respective first and second control signals, and a third switch configured to control connection between the first resistor and a first input terminal of the integrator based on a third control signal. The first through third control signals are generated based on the first digital signal and a second digital signal obtained by delaying the first digital signal. The third switch is turned on when any one of the first and second switches is turned on, and is turned off when both the first and second switches are turned off.

20 Claims, 15 Drawing Sheets

SEMICONDUCTOR DEVICE

CROSS-REFERENCE TO RELATED APPLICATIONS

This application claims the benefit of Korean Patent Application No. 10-2022-0007881, filed on Jan. 19, 2022, and Korean Patent Application No. 10-2022-0057004, filed on May 10, 2022, in the Korean Intellectual Property Office, the disclosures of which are incorporated herein by reference in their entireties.

TECHNICAL FIELD

The present disclosure relates generally to semiconductor devices and more particularly to analog to digital converters employing delta sigma modulation.

DISCUSSION OF THE RELATED ART

Many electronic device applications use analog to digital converters (ADCs) to convert analog signals into digital signals. An ADC is a device that receives an analog signal representing a continuous value, and converts the analog signal into a digital signal, e.g., comprising groups of n bits, where each group represents a discrete value of the analog signal at a respective time point thereof.

In a precision measurement system that performs measurement using sensors, measurement devices need to convert analog signals obtained from the sensors into digital signals to perform subsequent processing using a microcomputer ("micom") controller or the like. Examples of such sensors include a temperature sensor, a humidity sensor, a pressure sensor, a microphone, a radio receiver, and digital measurement equipment.

In particular, for measurement equipment requiring high resolution, a delta sigma modulator is widely used. A delta sigma modulator is a circuit that digitally encodes changes in an input analog signal between consecutive samples of the analog signal. The delta sigma modulator has the advantage of being able to convert an analog signal into a digital signal with a low cost and high resolution.

When a delta sigma modulator is designed, feedback digital-analog converter (DAC) technology applying a filter(s) may be used to reduce degradation of Signal-to-Noise Ratio (SNR) performance. However, the addition of one or more such filters may result in drawbacks such as an increase in the area of a DAC and an increase in circuit complexity.

SUMMARY

Aspects of the present disclosure provide a semiconductor device such as a delta sigma modulator type DAC with improved operating performance.

According to some aspects of the present disclosure, there is a provided semiconductor device comprising an integrator configured to receive a first input signal through a first input terminal and output a corresponding first output signal, and to receive a second input signal through a second input terminal and output a corresponding second output signal, a quantizer configured to generate a first digital signal based on the first and second output signals, a first switch configured to control application of a first reference voltage to a first resistor based on a first control signal, a second switch configured to control application of a second reference voltage to the first resistor based on a second control signal, and a third switch configured to control connection between the first resistor and the first input terminal based on a third control signal. The first through third control signals are generated based on the first digital signal and a second digital signal obtained by delaying the first digital signal. The third switch is turned on when any one of the first and second switches is turned on, and the third switch is turned off when both the first and second switches are turned off.

According to some aspects of the present disclosure, there is a provided semiconductor device comprising an integrator configured to receive a first input signal through a first input terminal and output a corresponding first output signal, and to receive a second input signal through a second input terminal and output a corresponding second output signal, a quantizer configured to generate a first digital signal based on the first and second output signals, a first switch configured to control application of a first reference voltage to a first resistor based on a first control signal, a second switch configured to control application of a second reference voltage to the first resistor based on a second control signal, a third switch configured to control connection between the first resistor and the first input terminal based on a third control signal, and a fourth switch configured to control connection between the first input terminal and the second input terminal based on a fourth control signal, wherein the first through fourth control signals are generated based on the first digital signal and a second digital signal obtained by delaying the first digital signal.

According to some aspects of the present disclosure, there is a provided semiconductor device comprising an integrator configured to receive a first input signal through a first input terminal and output a corresponding first output signal, and to receive a second input signal through a second input terminal and output a corresponding second output signal, a quantizer configured to generate a first digital signal based on the first and second output signals, a feedback circuit configured to provide any one of a first reference voltage and a second reference voltage to the first input terminal based on a control signal generated based on the first digital signal and a second digital signal obtained by delaying the first digital signal and provide any one of a third reference voltage and a fourth reference voltage to the second input terminal based on the control signal, a first switch configured to control connection between the feedback circuit and the first input terminal, and a second switch configured to control connection between the feedback circuit and the second input terminal.

Any of the semiconductor devices as summarized above may be at least a portion of a delta sigma modulator, e.g., of an analog to digital converter.

However, aspects of the present disclosure are not limited to those set forth above. The above and other aspects of the present disclosure will become more apparent to one of ordinary skill in the art to which the present disclosure pertains by referencing the detailed description of the present disclosure given below.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Hereinafter, embodiments according to the technical spirit of the present disclosure will be described with reference to the accompanying drawings.

Figure 1:
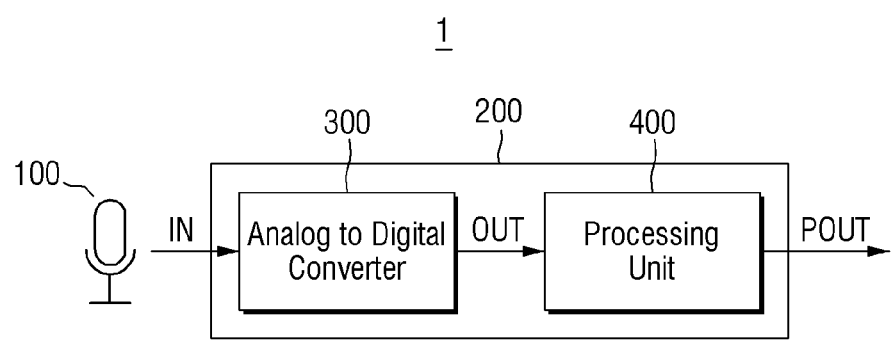
FIG. 1 is a block diagram of an analog signal processing system according to embodiments.

FIG. 1 is a block diagram of an analog signal processing system 1 according to embodiments. The analog signal processing system 1 may include an analog signal input/output (I/O) device 100, an analog to digital converter (ADC) 300, and a processing unit 400.

In some embodiments, the I/O device 100 receives an analog sound signal and outputs a corresponding analog electrical signal IN. In other embodiments, the I/O device 100 receives another type of analog signal such as an optical signal and outputs a corresponding analog electrical signal IN.

The ADC 300 may receive the analog electrical signal IN and output a digital representation of the analog electrical signal IN as a digital signal OUT.

The processing unit 400 may output a final output signal POUT by performing predetermined processing on the digital signal OUT output through the ADC 300.

Figure 2:
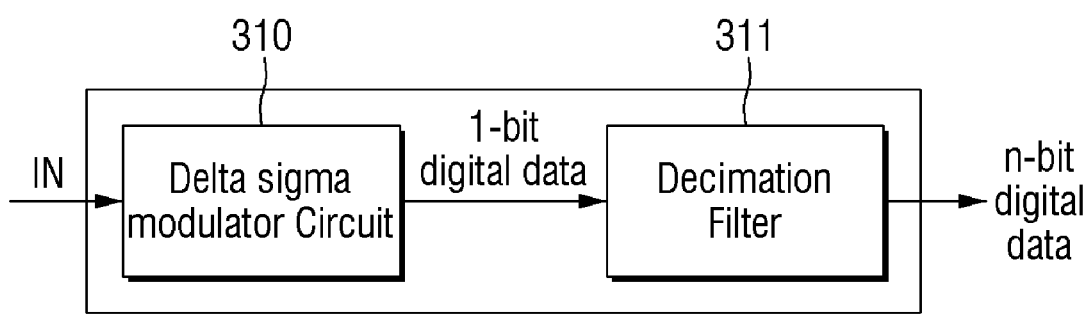
FIG. 2 is an exemplary block diagram of the analog digital converter of FIG. 1.

FIG. 2 is an exemplary block diagram of the ADC 300 of FIG. 1. Here, the ADC converter 300 may include a delta sigma modulator circuit 310 and a decimation filter 311. It is noted that additional components (not illustrated) may be further included.

The delta sigma modulator circuit 310 may receive an analog electrical signal IN and perform delta sigma modulation on the analog electrical signal IN.

The decimation filter 311 may receive, e.g., 1-bit digital data output from the delta sigma modulator circuit 310 and may output, e.g., n-bit digital data (n=two or more) by filtering the 1-bit digital data in accordance with a decimated (reduced frequency) rate.

Figure 3:
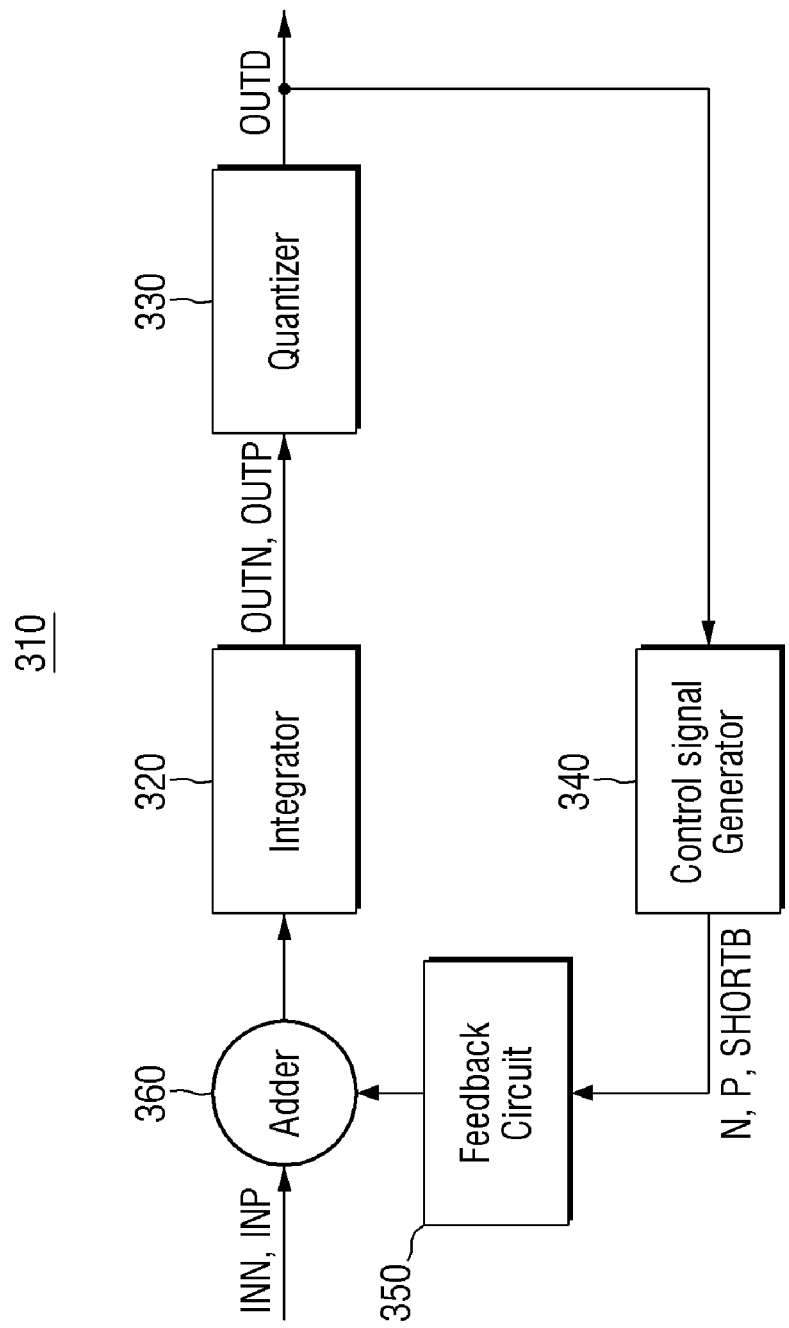
FIG. 3 is an exemplary block diagram of the delta sigma modulator circuit of FIG. 2.
Figure 4:
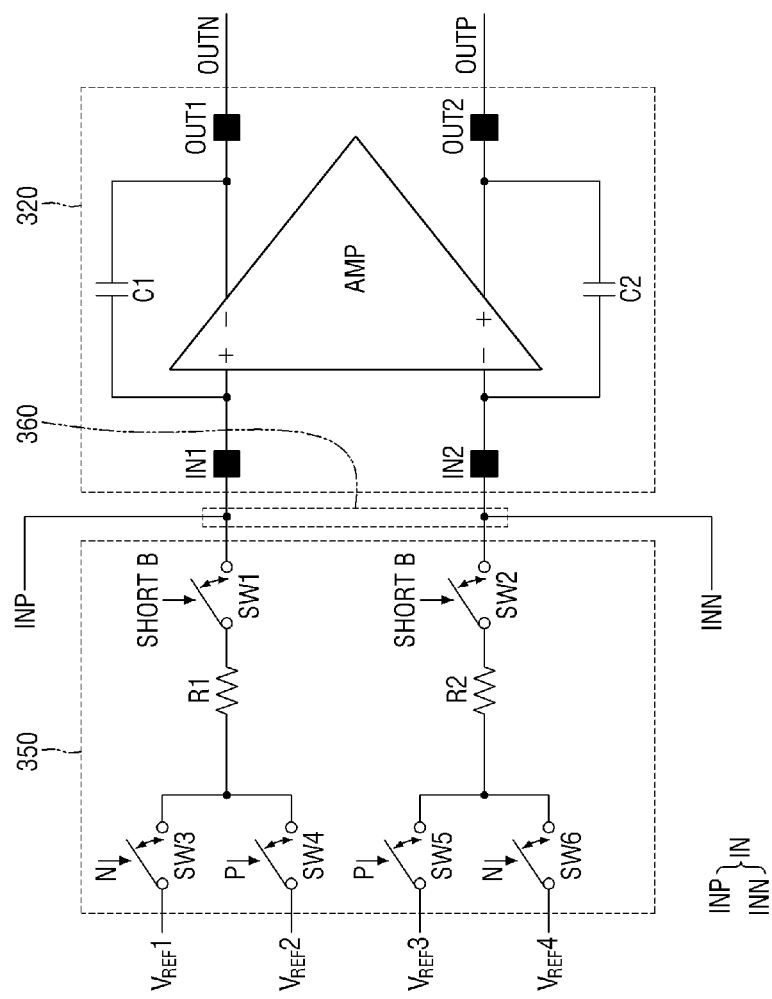
FIG. 4 is a circuit diagram of an integrator and a feedback circuit of FIG. 3.

FIG. 3 is an exemplary block diagram of the delta sigma modulator circuit 310 of FIG. 2. FIG. 4 is a circuit diagram of an integrator 320 and a feedback circuit 350 of FIG. 3.

Referring to FIGS. 3 and 4, the delta sigma modulator circuit 310 may include the integrator 320, a quantizer 330, a control signal generator 340, the feedback circuit 350, and an adder 360.

The adder 360 may add input signals INN and INP and a signal output from the feedback circuit 350 and provide the result of addition to the integrator 320. As shown in FIG. 4, and exemplary adder 360 is schematically shown as just a pair of nodes receiving the input signals INP and INN, respectively, and connected between output terminals of the feedback circuit 350 and input terminals of the integrator 320.

The integrator 320 may generate output signals OUTN and OUTP by integrating the input signals INN and INP and the signal output from the feedback circuit 350.

In some embodiments, the input signal INN and the input signal INP are differential signals. In other embodiments, the input signal INN and INP are single ended signals. The input signal IN discussed above may be comprised of the pair of input signals INN and INP.

The integrator 320 may include an amplifier AMP, a capacitor C1, a capacitor C2, an input terminal IN1, an input terminal IN2, an output terminal OUT1, and an output terminal OUT2.

The input terminal IN1 may be connected to a positive (+) input terminal of the amplifier AMP. The input signal INP may be provided to the input terminal IN1.

The input terminal IN2 may be connected to a negative (−) input terminal of the amplifier AMP. The input signal INN may be provided to the input terminal IN2.

The output terminal OUT1 may be connected to a negative (−) output terminal of the amplifier AMP. The output signal OUTN generated by the integrator 320 may be output through the output terminal OUT1.

The output terminal OUT2 may be connected to a positive (+) output terminal of the amplifier AMP. The output signal OUTP generated by the integrator 320 may be output through the output terminal OUT2.

The capacitor C1 may be connected between the input terminal IN1 and the output terminal OUT1. The capacitor C2 may be connected between the input terminal IN2 and the output terminal OUT2.

The quantizer 330 may divide amplitude intervals of the analog signals OUTN and OUTP output from the integrator 320, represent analog signals of the respective intervals as representative values, and then convert the representative values into digital output signals OUTD.

The feedback circuit 350 may receive control signals N, P and SHORT B from the control signal generator 340, generate a feedback signal using the control signals N, P and SHORT B, and provide the feedback signal to the adder 360.

The feedback circuit 350 may include a resistor R1, a resistor R2, and switches SW1 through SW6.

The switch SW1 may be disposed between the resistor R1 and the input terminal IN1 to control connection between the resistor R1 and the input terminal IN1. The switch SW1 may be turned on when the control signal SHORT B is at a first level (e.g., a logic high level H) and may connect the resistor R1 and the input terminal IN1. The switch SW1 may be turned off when the control signal SHORT B is at a second level (e.g., a logic low level L) and may not connect the resistor R1 and the input terminal IN1.

The switch SW2 may be disposed between the resistor R2 and the input terminal IN2 to control connection between the resistor R2 and the input terminal IN2. The switch SW2 may be turned on when the control signal SHORT B is at the first level H and may thereby connect the resistor R2 and the input terminal IN2. The switch SW2 may be turned off when the control signal SHORT B is at the second level L and may thereby not connect the resistor R2 and the input terminal IN2.

The switch SW3 may switchedly apply a reference voltage $V_{REF}1$ to the resistor R1 based on the control signal N. The switch SW3 may be turned on when the control signal N is received at a first predetermined level (e.g., when the control signal N is at the first level H) and may apply the reference voltage $V_{REF}1$ to the resistor R1. The switch SW3 may be turned off when the control signal N is not received (for example, when the control signal N is at a second predetermined level, e.g., the second level L) and thereby not apply the reference voltage $V_{REF}1$ to the resistor R1.

The switch SW4 may switchedly apply a reference voltage $V_{REF}2$ to the resistor R1. The switch SW4 may be turned on when the control signal P is received (e.g., when the control signal P is at the first level H) to apply the reference voltage $V_{REF}2$ to the resistor R1. The switch SW4 may be turned off when the control signal P is not received (e.g., when the control signal P is at the second level L) and thereby not apply the reference voltage $V_{REF}2$.

The switch SW5 may switchedly apply a reference voltage $V_{REF}3$ to the resistor R2. The switch SW5 may be turned on when the control signal P is received and thereby apply the reference voltage $V_{REF}3$ to the resistor R2. The switch SW5 may be turned off when the control signal P is not received and thereby not apply the reference voltage $V_{REF}3$ to the resistor R2.

The switch SW6 may switchedly apply a reference voltage $V_{REF}4$ to the resistor R2. The switch SW6 may be turned on when the control signal N is received to apply the reference voltage $V_{REF}4$ to the resistor R2. The switch SW6 may be turned off when the control signal N is not received and thereby not apply the reference voltage $V_{REF}4$ to the resistor R2.

The reference voltages $V_{REF}1$ through $V_{REF}4$ may be determined at appropriate levels for the feedback circuit 350 to perform a feedback operation on the input signals INN and INP in response to the control signals N, P and SHORT B.

One example of the reference voltages $V_{REF}1$ and $V_{REF}3$ is 1.8 V, and one example of the reference voltages $V_{REF}2$ and $V_{REF}4$ is 0 V, but any suitable levels may be set in other examples.

The control signal generator 340 may generate the control signals N, P and SHORT B based on the digital output signal OUTD and provide the control signals N, P and SHORT B to the feedback circuit 350.

The control signal generator 340 will now be described in more detail with reference to FIG. 5.

Figure 5:
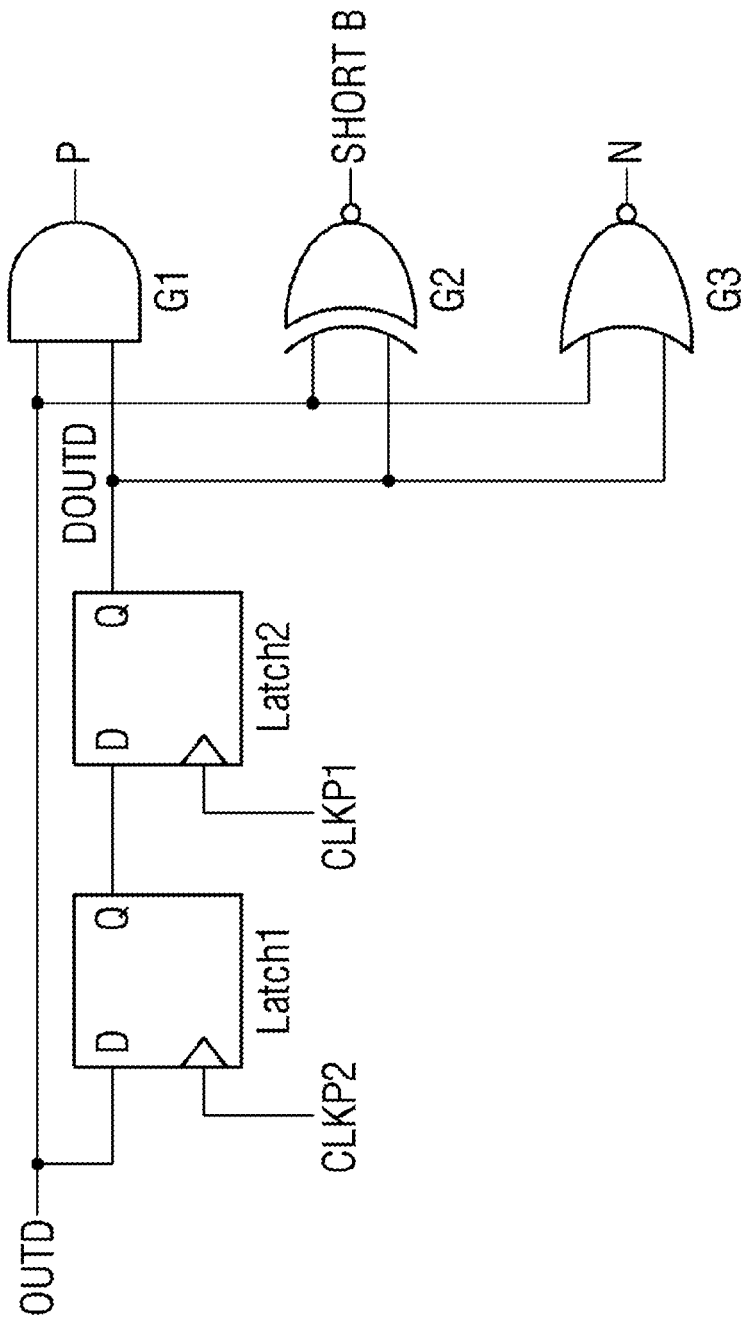
FIG. 5 is an exemplary circuit diagram of the control signal generator of FIG. 3.

FIG. 5 is an exemplary circuit diagram of the control signal generator 340 of FIG. 3. In this example, the control signal generator 340 may include a first latch Latch1, a second latch Latch2, a first logic gate G1, a second logic gate G2, and a third logic gate G3.

The first latch Latch1 may receive a clock signal CLKP2 and output the received digital output signal OUTD to the second latch Latch2 based on the clock signal CLKP2. The second latch Latch2 may receive a clock signal CLKP1 and output a delayed digital output signal DOUTD based on the clock signal CLKP1. Here, the delayed digital output signal DOUTD may be a signal obtained by delaying the digital output signal OUTD by a predetermined time, e.g., one clock cycle of the clock signal CLKP1.

The first logic gate G1 may receive the digital output signal OUTD and the delayed digital output signal DOUTD, perform an AND computation on the digital output signal OUTD and the delayed digital output signal DOUTD, and then output the result of the AND computation as the control signal P.

The second logic gate G2 may receive the digital output signal OUTD and the delayed digital output signal DOUTD, perform an XNOR computation on the digital output signal OUTD and the delayed digital output signal DOUTD, and then output the result of the XNOR computation as the control signal SHORT B.

The third logic gate G3 may receive the digital output signal OUTD and the delayed digital output signal DOUTD, perform a NOR computation on the digital output signal OUTD and the delayed digital output signal DOUTD, and output the result of the NOR computation as the control signal N.

Therefore, the control signals N, P, and SHORT B generated by the control signal generator 340 may be generated based on the digital output signal OUTD and the delayed digital output signal DOUTD. In addition, whether the feedback circuit 350 will perform a feedback operation (apply signals to the integrator during certain time intervals) may be determined according to the control signals N, P, and SHORT B generated by the control signal generator 340.

Figure 6:
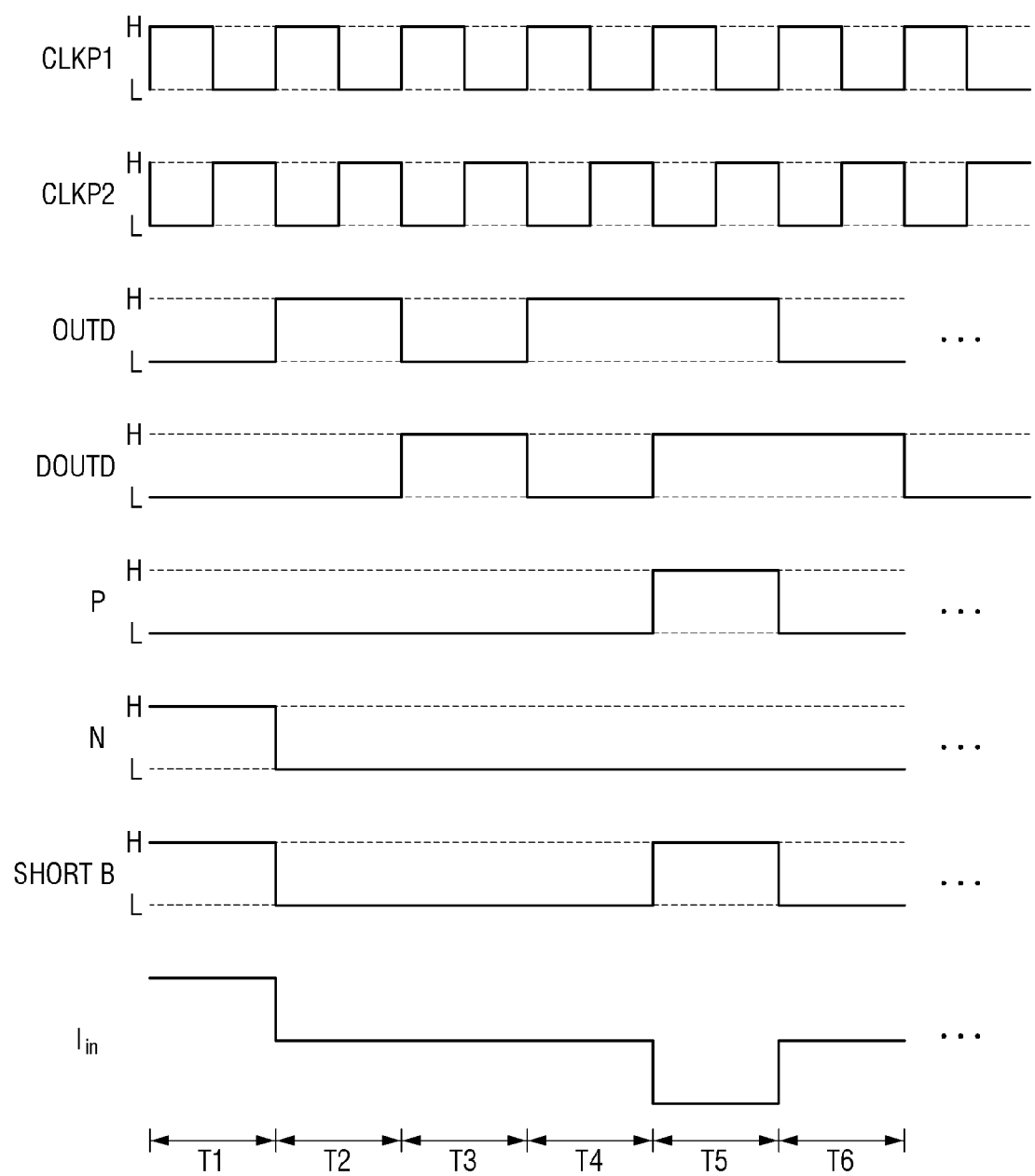
FIG. 6 is a timing diagram for explaining the operation of a semiconductor device according to embodiments.
Figure 7:
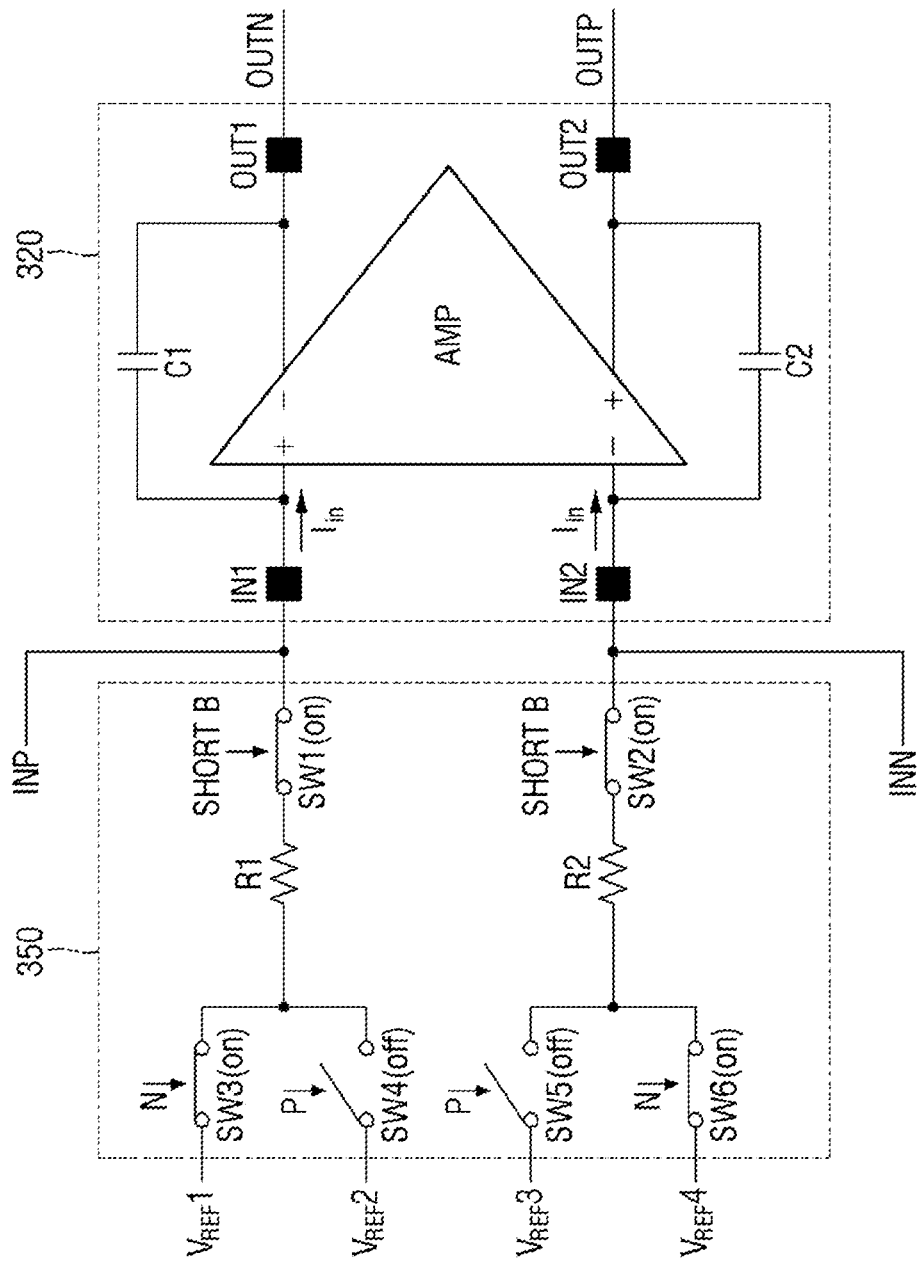
FIGS. 7, 8 and 9 are diagrams for explaining the operation of the semiconductor device according to embodiments.
Figure 8:
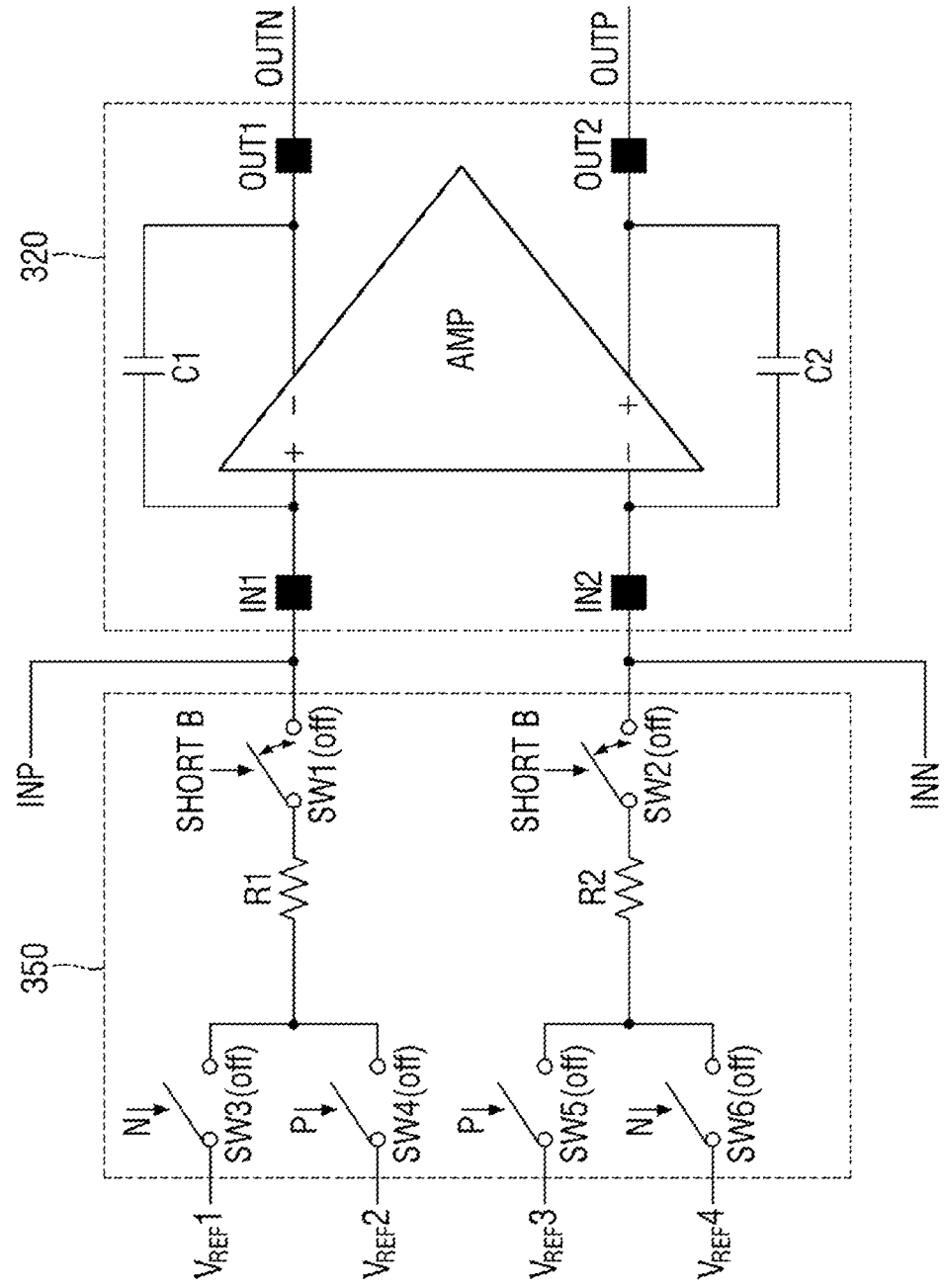
Figure 9:
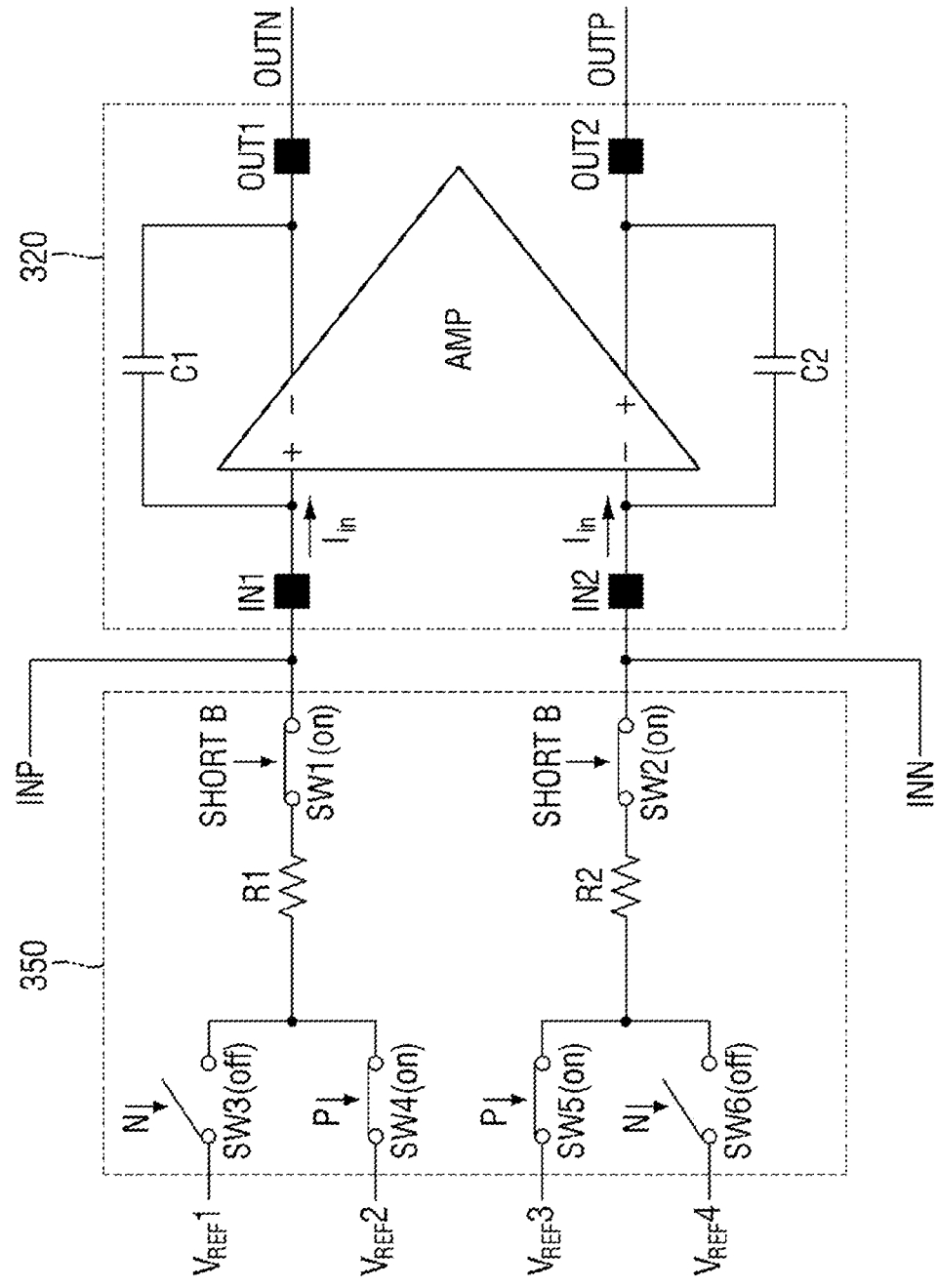

FIG. 6 is a timing diagram for explaining example operations of a semiconductor device, e.g., the DAC circuitry of FIG. 4, according to an embodiment. FIGS. 7 through 9 are diagrams depicting switching states of the DAC circuitry of FIG. 4 for explaining operations of the semiconductor device according to the embodiments.

Referring to FIGS. 5 and 6, during a first period T1, values of the digital output signal OUTD and the delayed digital output signal DOUTD are L during a first period T1. This causes: (i) a value of the control signal N to become H, which is obtained as a result of performing a NOR computation on L and L; (ii) a value of the control signal P to become L, which is obtained as a result of performing an AND computation on L and L; and (iii) a value of the control signal SHORT_B to become H, which is obtained as a result of performing an XNOR computation on L and L.

Referring to FIG. 7, since the control signal N is H and the control signal P is L, the switch SW3 and the switch SW6 are turned on, and the switch SW4 and the switch SW5 are turned off. Accordingly, the reference voltage $V_{REF}1$ is provided to the resistor R1, and the reference voltage $V_{REF}4$ is provided to the resistor R2. Thus, the feedback circuit 350 generates a feedback signal.

Meanwhile, since the control signal SHORT_B is H, the switch SW1 is turned on to connect the resistor R1 and the input terminal IN1. In addition, since the control signal SHORT B is H, the switch SW2 is turned on to connect the resistor R2 and the input terminal IN2. Accordingly, a feedback operation is performed by application of the reference voltages $V_{REF}1$ and $V_{REF}4$, so that a current Iin flows from the resistor R1 to the input terminal IN1 and flows from the resistor R2 to the input terminal IN2.

Next, referring to FIG. 6, the value of the digital output signal OUTD is H, and the value of the delayed digital output signal DOUTD is L during a second period T2. During this period, as understood from the logic gates of FIG. 5: the value of the control signal N becomes L, which is obtained as a result of performing a NOR computation on H and L; the value of the control signal P becomes L, which is obtained as a result of performing an AND computation on H and L; and the value of the control signal SHORT B becomes L, which is obtained as a result of performing an XNOR computation on H and L.

Referring to FIG. 8, since the control signal N is L and the control signal P is L, the switches SW3 through SW6 are turned off. Accordingly, none of the reference voltages $V_{REF}1$ to $V_{REF}4$ are provided to the resistors R1 and R2. Consequently, the feedback circuit 350 does not generate a feedback signal. Meanwhile, since the control signal SHORT B is L, the switch SW1 is turned off so that the resistor R1 and the input terminal IN1 are not connected. In addition, since the control signal SHORT B is L, the switch SW2 is turned off so that the resistor R2 and the input terminal IN2 are not connected.

At this time, the current Iin does not flow from the resistor R1 to the first input terminal IN1 and does not flow from the resistor R2 to the second input terminal IN2. (It is noted that the current Iin shown in FIGS. 6, 7 and 9 may be understood as current caused by the feedback circuit 350. During time periods in which the feedback circuit 350 is effectively disconnected from the integrator 320, as in the circuit state of FIG. 8, current (not shown) may still flow at the input terminals IN1 and IN2 of the amplifier AMP due to the input signals INP and INN.)

Therefore, when none of the reference voltages $V_{REF1}$ to $V_{REF}4$ are applied to the resistors R1 and R2 (such that the feedback circuit 350 does not perform a feedback operation), the switches SW1 and SW2 disconnect the resistor R1 from the first input terminal IN1 and disconnect the resistor R2 from the second input terminal IN2. The resistors R1 and R2 may generate thermal noise when the integrator 320 operates. In the current embodiment, when the resistors R1 and R2 are to be disconnected from the integrator 320 during periods in which the feedback circuit 350 does not perform a feedback operation, the connection between the resistors R1 and R2 and the integrator 320 is removed. Therefore, thermal noise of the delta sigma modulator circuit 310 may be reduced. As a result, the operating performance of the circuit may be improved.

Referring still to FIGS. 5 and 6, during a third period T3, the value of the digital output signal OUTD is L, and the value of the delayed digital output signal DOUTD is H. This causes: the value of the control signal N is L, which is obtained as a result of performing a NOR computation on L and H; the value of the control signal P becomes L, which is obtained as a result of performing an AND computation on L and H; and the value of the control signal SHORT B becomes L, which is obtained as a result of performing an XNOR computation on L and H.

Referring to FIG. 8, since the control signal N is L and the control signal P is L, the switches SW3 through SW6 are turned off. Accordingly, none of the reference voltages $V_{REF1}$ to $V_{REF}4$ are provided to the resistors R1 and R2. Meanwhile, since the control signal SHORT B is L, the switch SW1 is turned off so that the resistor R1 and the input terminal IN1 are not connected. In addition, since the control signal SHORT B is L, the switch SW2 is turned off so that the resistor R2 and the input terminal IN2 are not connected.

At this time, the current Iin does not flow from the resistor R1 to the first input terminal IN1 and does not flow from the resistor R2 to the second input terminal IN2.

Therefore, when none of the reference voltages $V_{REF1}$ $V_{REF}4$ are applied to the resistors R1 and R2 (which is during time intervals when the feedback circuit 350 does not perform a feedback operation), the switches SW1 and SW2 disconnect the resistor R1 from the first input terminal IN1 and disconnect the resistor R2 from the second input terminal IN2, thereby reducing thermal noise of the resistors.

Referring to FIG. 6, during a fourth period T4, the feedback circuit 350 may perform the same operation as in the above-described second period T2. Therefore, redundant descriptions will be omitted.

Referring to FIGS. 5 and 6, during a fifth period T5, the values of the digital output signal OUTD and the delayed digital output signal DOUTD are H This results in: the value of the control signal N becomes L, which is obtained as a result of performing a NOR computation on H and H; the value of the control signal P becomes H, which is obtained as a result of performing an AND computation on H and H; and the value of the control signal SHORT B becomes H, which is obtained as a result of performing an XNOR computation on H and H.

Referring to FIG. 9, since the control signal N is L and the control signal P is H, the switch SW3 and the switch SW6 are turned off, and the switch SW4 and the switch SW5 are turned on. Accordingly, the reference voltage $V_{REF}2$ is provided to the resistor R1, and the reference voltage $V_{REF}3$ is provided to the resistor R2.

Meanwhile, since the control signal SHORT B is H, the switch SW1 is turned on to connect the resistor R1 and the input terminal IN1.

In addition, since the control signal SHORT B is H, the switch SW2 is turned on to connect the resistor R2 and the input terminal IN2.

Accordingly, a feedback operation is performed by the reference voltages $V_{REF}2$ and $V_{REF}3$, so that the current Iin flows from the input terminal IN1 to the resistor R1 and flows from the input terminal IN2 to the resistor R2.

It is noted here, in an example embodiment, the reference voltages $V_{REF}1$ and $V_{REF}4$ may be positive voltages, whereas the voltages $V_{REF}2$ and $V_{REF}3$ may be negative voltages. Consequently, as depicted in FIG. 6, the currents Iin may have a positive value during the time period T1 when $V_{REF}1$ and $V_{REF}4$ are applied towards the integrator 320, and may have a negative value during the time period T5 when $V_{REF}2$ and $V_{REF}3$ are applied. This selective application of positive or negative voltages during respective time periods (which may depend on OUTN and OUTP) may facilitate delta sigma modulation functionality. It is further noted that the values of $V_{REF}1$ to $V_{REF}4$ may be selected according to the application.

Referring to FIG. 6, during a sixth period T6, the feedback circuit 350 performs the same operation as in the above-described third period T3. Therefore, redundant descriptions will be omitted.

As described above, the feedback circuit 350 according to the current embodiment can reduce thermal noise of resistors by disconnecting the resistors R1 and R2 from the input terminals IN1 and IN2 using the switches SW1 and SW2 when not performing a feedback operation. Therefore, the operating performance of the semiconductor device can be improved.

Figure 10:
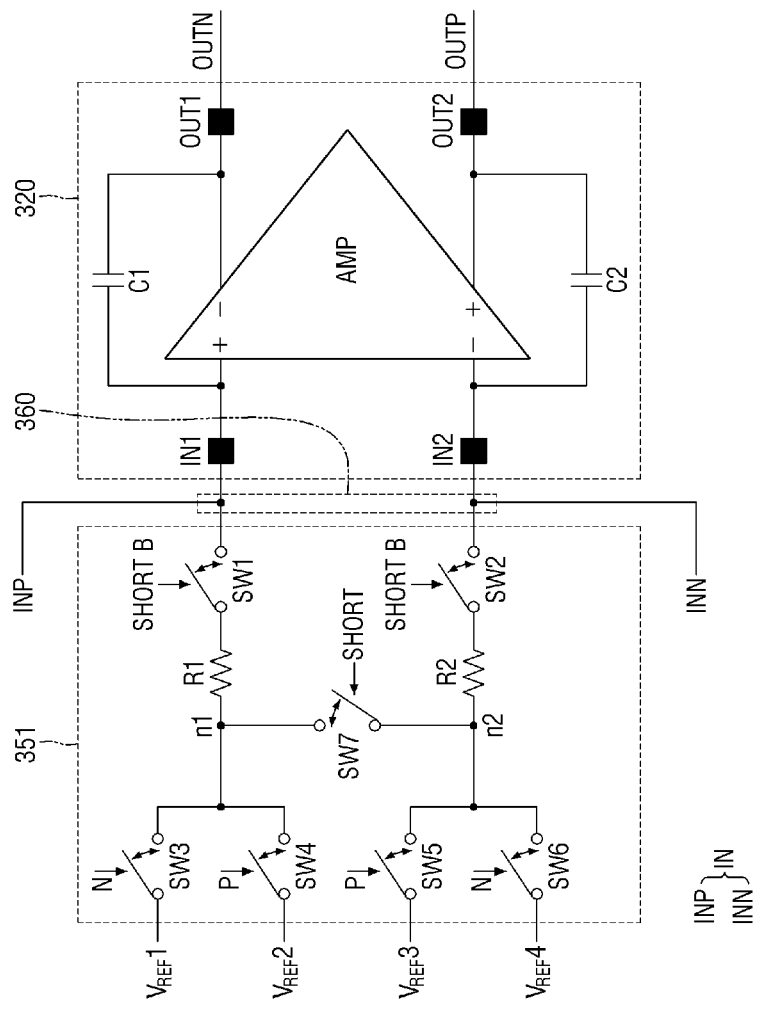
FIG. 10 is a circuit diagram of a delta sigma modulator circuit according to another embodiment.
Figure 11:
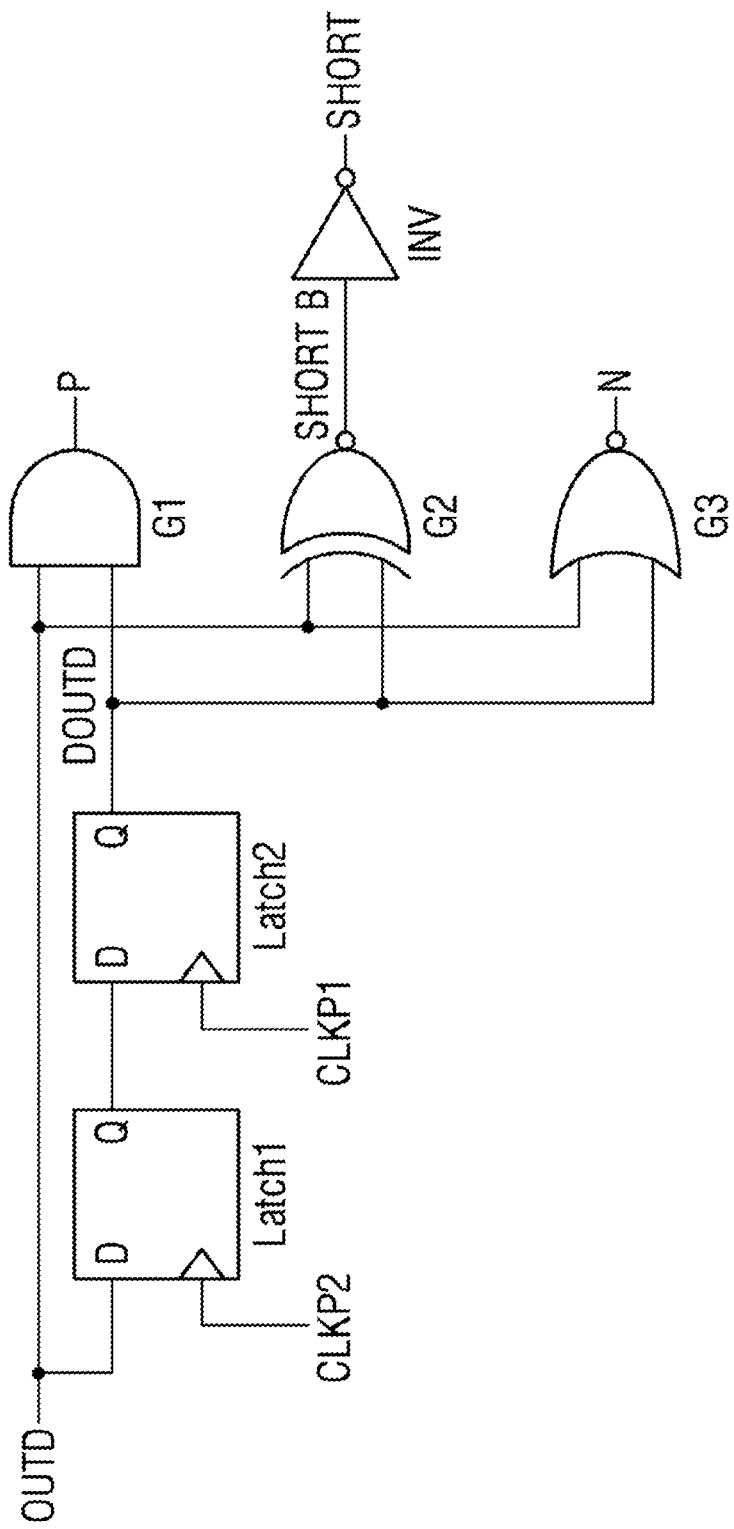
FIG. 11 is an exemplary circuit diagram of a control signal generator that may provide the control signals of the circuit of FIG. 10.

FIG. 10 is a circuit diagram of delta sigma modulator (DSM) circuitry according to another embodiment, which circuitry may be utilized in the delta sigma modulator circuit of FIG. 3. FIG. 11 is an exemplary circuit diagram of a control signal generator 341 that may be used to generate control signals applied according to these embodiments.

Descriptions overlapping those of the above-described embodiment of FIGS. 4-9 will be omitted, and differences will be mainly described below. In FIG. 10, a feedback circuit 351 is an example of the feedback circuit 350 of FIG. 3.

Referring to FIGS. 10 and 11, the feedback circuit 351 may receive control signals N, P, SHORT B and SHORT from the control signal generator 341 and generate a feedback signal using these control signals.

The feedback circuit 351 may include a resistor R1, a resistor R2, and switches SW1 through SW7. The switch SW7 may be disposed between a node n1 and a node n2 to control connection between the nodes n1 and n2. The switch SW7 may be turned on when the control signal SHORT is at a first level H, to the node n1 and the node n2. The switch SW7 may be turned off when the control signal SHORT is at a second level L and thereby not connect the node n1 and the node n2.

As shown in FIG. 11, the control signal generator 341 may differ from the control signal generator 340 of FIG. 5 described above by further including an inverter INV. In this case, a second logic gate G2 of the control signal generator 341 may receive a digital output signal OUTD and a delayed digital output signal DOUTD, perform an XNOR computation on the digital output signal OUTD and the delayed digital output signal DOUTD, and then output the result of the XNOR computation as the control signal SHORT B. The inverter INV may output the control signal SHORT by inverting the control signal SHORT B.

Figure 12:
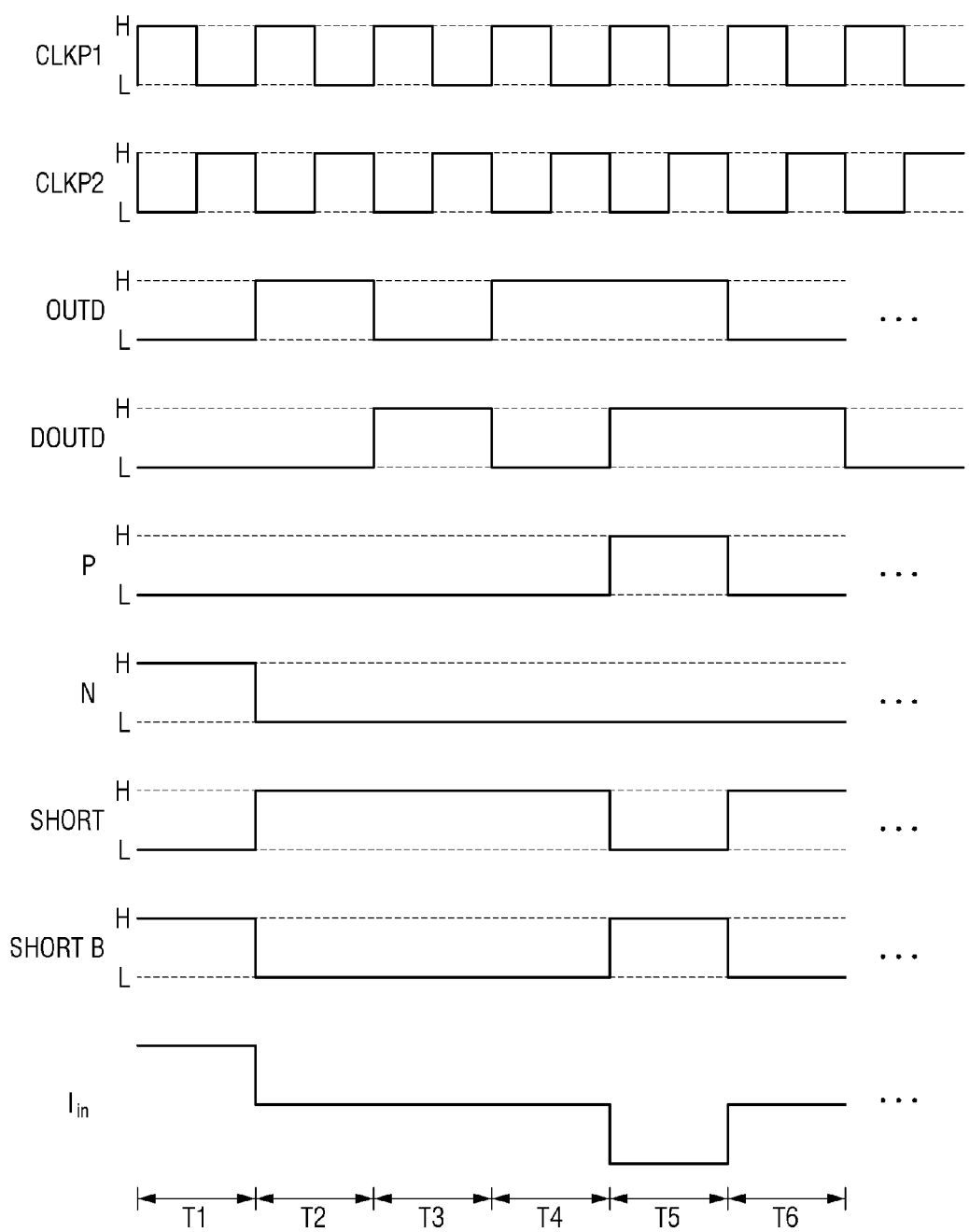
FIG. 12 is a timing diagram for explaining the operation of the circuit of FIG. 10.
Figure 13:
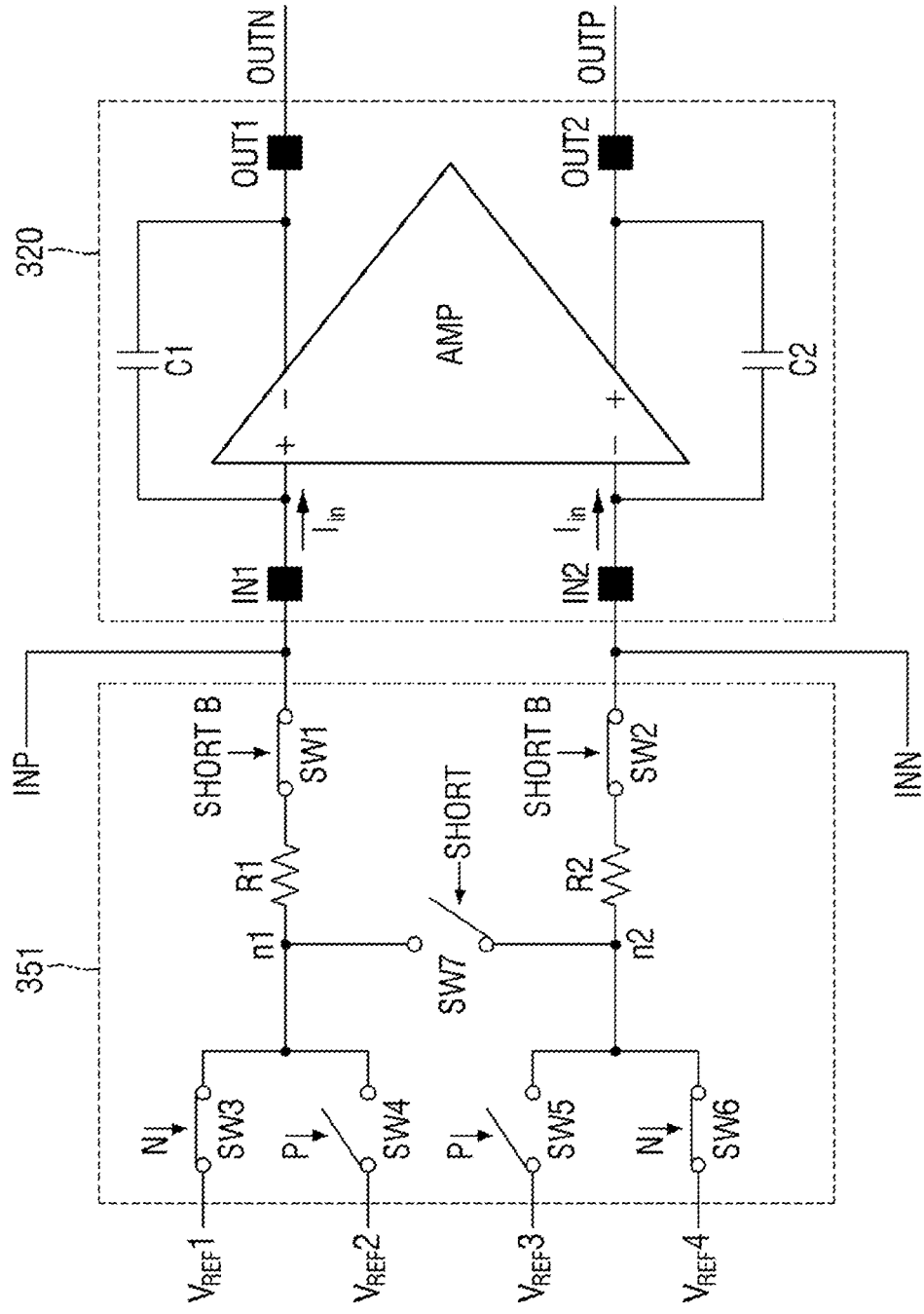
FIGS. 13, 14 and 15 are diagrams for explaining the operation of the circuitry of FIG. 10.
Figure 14:
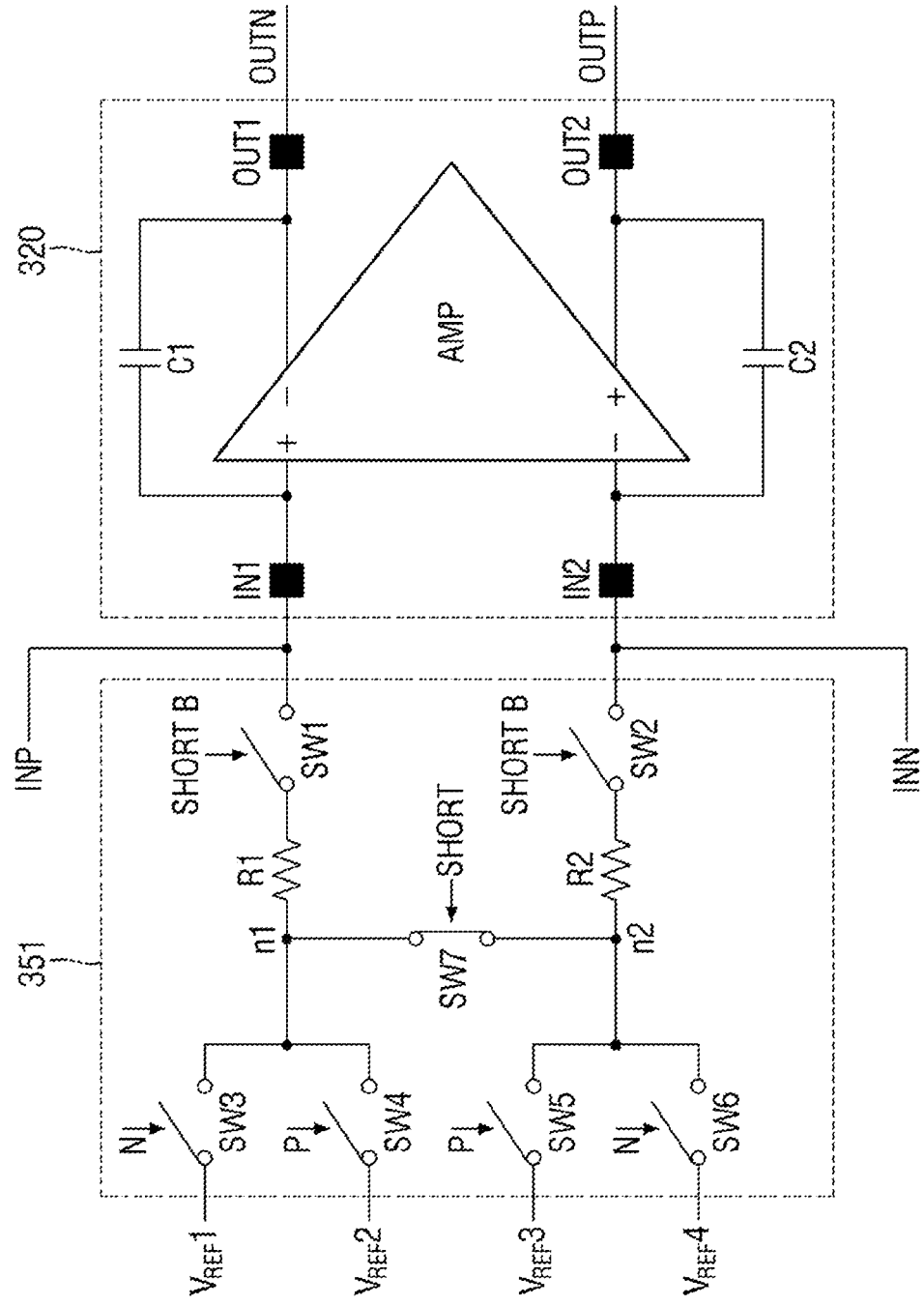
Figure 15:
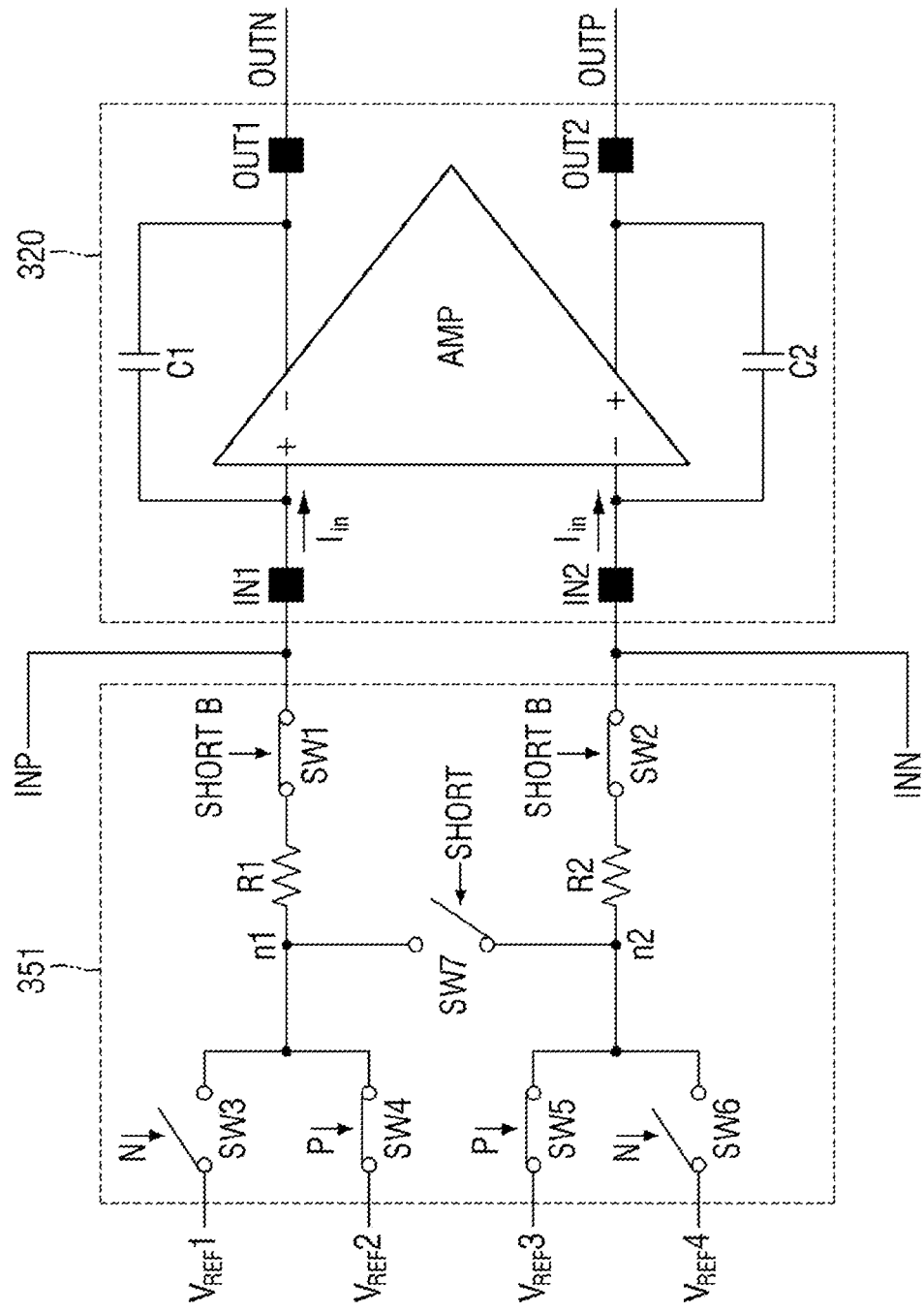

FIG. 12 is a timing diagram for explaining operations of a DAC or other semiconductor device including the DSM circuitry of FIGS. 10-11. FIGS. 13 through 15 are diagrams for explaining the operation of the DSM circuitry of FIGS. 10-11.

As shown in FIG. 12, during a first period T1, values of the digital output signal OUTD and the delayed digital output signal DOUTD may each be L.

Referring to FIGS. 11 and 12, when the values of both the digital output signal OUTD and the delayed digital output signal DOUTD are L (during the first period T1), a value of the control signal N becomes H. This result is obtained by performing a NOR computation on L and L. Further, a value of the control signal P becomes L, which result is obtained by performing an AND computation on L and L; and a value of the control signal SHORT B becomes H, which result is obtained by performing an XNOR computation on L and L. Lastly, a value of the control signal SHORT becomes L, which is obtained as a result of inverting the value of the control signal SHORT B.

Referring to FIG. 13, since the control signal N is H and the control signal P is L, the switch SW3 and the switch SW6 are turned on, and the switch SW4 and the switch SW5 are turned off. Accordingly, a reference voltage $V_{REF1}$ is provided to the resistor R1, and a reference voltage $V_{REF}4$ is provided to the resistor R2.

Meanwhile, since the control signal SHORT B is H, the switch SW1 is turned on to connect the resistor R1 and an input terminal IN1, and the switch SW2 is turned on to connect the resistor R2 and an input terminal IN2.

In addition, since the control signal SHORT is L, the switch SW7 is turned off so that the node n1 and the node n2 are not connected. Hence, the switch SW7 is not turned on while the feedback circuit 351 performs a feedback operation.

Accordingly, a feedback operation is performed through application of the reference voltages $V_{REF}1$ and $V_{REF}4$ to the respective resistors R1 and R2, so that a current Iin flows from the resistor R1 to the input terminal IN1 and a current Iin also flows from the resistor R2 to the input terminal IN2.

Referring to FIG. 11 and FIG. 12, during a second period T2, the value of the digital output signal OUTD is H, and the value of the delayed digital output signal DOUTD is L. This results in: (i) the value of the control signal N is L, which is obtained as a result of performing a NOR computation on H and L; (ii) the value of the control signal P becomes L, which is obtained as a result of performing an AND computation on H and L; (iii) the value of the control signal SHORT B becomes L, which is obtained as a result of performing an XNOR computation on H and L; and (iv) the value of the control signal SHORT becomes H, which is obtained as a result of inverting the value of the control signal SHORT B.

Referring to FIGS. 12 and 14, during the second period T2, since the control signal N is L and the control signal P is L, the switches SW3 through SW6 are turned off. Accordingly, a reference voltage $V_{REF}$ is not provided to the resistors R1 and R2. Meanwhile, since the control signal SHORT B is L, the switch SW1 is turned off so that the resistor R1 and the input terminal IN1 are not connected, and the switch SW2 is turned off so that the resistor R2 and the input terminal IN2 are not connected. Accordingly, the current Iin does not flow from the resistor R1 to the first input terminal IN1 and does not flow from the resistor R2 to the second input terminal IN2. (Iin is zero as seen in FIG. 12.)

At this time, during the second period T2, since the control signal SHORT is H, the switch SW7 is turned on. Thus, while the feedback circuit 351 does not perform a feedback operation (in other words, no signal is fed back during the second period T2), the switch SW7 is turned on to connect the node n1 and the node n2. Accordingly, while the feedback circuit 351 does not perform a feedback operation, a potential difference between the node n1 and the node n2 is maintained substantially the same. This can prevent degradation of total harmonic distortion when the feedback circuit 351 transitions to perform a feedback operation.

With continuing reference to FIG. 12, during a third period T3, the value of the digital output signal OUTD is L, and the value of the delayed digital output signal DOUTD is H. In this case, as understood from FIG. 11: (i) the value of the control signal N becomes L, which is obtained as a result of performing a NOR computation on L and H; (ii) the value of the control signal P becomes L, which is obtained as a result of performing an AND computation on L and H; (iii) the value of the control signal SHORT B becomes L, which is obtained as a result of performing an XNOR computation on L and H; and (iv) the value of the control signal SHORT becomes H which is obtained as a result of inverting the value of the control signal SHORT B.

Referring to FIG. 14, since the control signal N is L and the control signal P is L, the switches SW3 through SW6 remain off. Accordingly, the reference voltage $V_{REF}$ is not provided to the resistors R1 and R2.

Meanwhile, since the control signal SHORT B is L, the switch SW1 is turned off so that the resistor R1 and the input terminal IN1 are not connected, and the switch SW2 is turned off so that the resistor R2 and the input terminal IN2 are not connected.

Accordingly, the current Iin does not flow from the resistor R1 to the first input terminal IN1 and does not flow from the resistor R2 to the second input terminal IN2.

At this time, since the control signal SHORT is H, the switch SW7 is turned on to bring the potential difference between the node n1 and the node n2 close to zero, thereby preventing degradation of total harmonic distortion.

During a fourth period T4, OUTD transitions to H and DOUTD transitions to L. Under these conditions, the feedback circuit 351 may perform the same operations as in the above-described second period T2 (e.g., control signals P and N remain at L, SHORT is H and SHORT B is L, whereby Iin remains at zero).

During a fifth period T5, the values of the digital output signal OUTD and the delayed digital output signal DOUTD are H. This results in: the value of the control signal N becomes L, which is obtained as a result of performing a NOR computation on H and H; the value of the control signal P becomes H which is obtained as a result of performing an AND computation on H and H; the value of the control signal SHORT B becomes H, which is obtained as a result of performing an XNOR computation on H and H; and the value of the control signal SHORT becomes L, which is obtained as a result of inverting the value of the control signal SHORT B. As shown in FIG. 15, since the control signal N is L and the control signal P is H, the switch SW3 and the switch SW6 are turned off, and the switch SW4 and the switch SW5 are turned on. Accordingly, a reference voltage $V_{REF}2$ is provided to the resistor R1, and a reference voltage $V_{REF}3$ is provided to the resistor R2.

Meanwhile, during the fifth period T5, since the control signal SHORT B is H, the switch SW1 is turned on to connect the resistor R1 and the input terminal IN1, and the switch SW2 is turned on to connect the resistor R2 and the input terminal IN2. In addition, since the control signal SHORT is L, the switch SW7 is turned off so that the node n1 and the node n2 are not connected. Accordingly, a feedback operation is performed by the reference voltages $V_{REF}2$ and $V_{REF}3$, so that the current Iin flows from the input terminal IN1 to the resistor R1 and flows from the input terminal IN2 to the resistor R2.

Referring to FIG. 12, during a sixth period T6, the feedback circuit 351 performs the same operation as in the above-described third period T3. Therefore, description of the feedback circuit 351 operation in the sixth period T6 will be omitted for brevity.

As described above, the feedback circuit 351 according to the current embodiment may bring the potential difference close to zero by disconnecting the node n1 and the node n2 using the switch SW7 when not performing a feedback operation (in other words, during time periods at which the feedback circuit 351 does not apply a signal to the adder 360). Therefore, degradation of total harmonic distortion can be prevented.

While the present disclosure has been particularly illustrated and described with reference to exemplary embodiments thereof, it will be understood by those of ordinary skill in the art that various changes in form and detail may be made therein without departing from the spirit and scope of the present disclosure as defined by the following claims. The exemplary embodiments should be considered in a descriptive sense only and not for purposes of limitation.

What is claimed is:
1. A semiconductor device comprising:
an integrator configured to receive a first input signal through a first input terminal and output a corresponding first output signal, and to receive a second input signal through a second input terminal and output a corresponding second output signal;
a quantizer configured to generate a first digital signal based on the first and second output signals;
a first switch configured to control application of a first reference voltage to a first resistor based on a first control signal;
a second switch configured to control application of a second reference voltage to the first resistor based on a second control signal; and
a third switch configured to control connection between the first resistor and the first input terminal based on a third control signal,
wherein,
the first through third control signals are generated based on the first digital signal and a second digital signal obtained by delaying the first digital signal,
the third switch is turned on when any one of the first and second switches is turned on, and
the third switch is turned off when both the first and second switches are turned off.

2. The semiconductor device of claim 1, further comprising a control signal generator configured to generate the first through third control signals, wherein the control signal generator comprises a first logic gate outputting the third control signal by performing an XNOR computation on the first digital signal and the second digital signal.

3. The semiconductor device of claim 2, wherein the control signal generator further comprises a second logic gate outputting the second control signal by performing an AND computation on the first digital signal and the second digital signal.

4. The semiconductor device of claim 3, wherein the control signal generator further comprises a third logic gate outputting the first control signal by performing a NOR computation on the first digital signal and the second digital signal.

5. The semiconductor device of claim 2, wherein the control signal generator further comprises a first latch and a second latch generating the second digital signal from the first digital signal.

6. The semiconductor device of claim 1, further comprising a fourth switch configured to control connection between the first input terminal and the second input terminal based on a fourth control signal.

7. The semiconductor device of claim 6, wherein the fourth switch is turned off when any one of the first reference voltage and the second reference voltage is applied to the first resistor and is turned on when both the first reference voltage and the second reference voltage are not applied to the first resistor.

8. The semiconductor device of claim 7, further comprising a control signal generator configured to generate the first through fourth control signals, wherein the control signal generator comprises a first logic gate outputting the third control signal by performing an XNOR computation on the first digital signal and the second digital signal and an inverter outputting the fourth control signal by inverting the third control signal.

9. The semiconductor device of claim 8, wherein the control signal generator further comprises a second logic gate outputting the second control signal by performing an AND computation on the first digital signal and the second digital signal.

10. The semiconductor device of claim 9, wherein the control signal generator further comprises a third logic gate outputting the first control signal by performing a NOR computation on the first digital signal and the second digital signal.

11. The semiconductor device of claim 1, further comprising:
a fifth switch configured to control application of a third reference voltage to a second resistor based on the second control signal;
a sixth switch configured to control application of a fourth reference voltage to the second resistor based on the first control signal; and
a seventh switch configured to control connection between the second resistor and the second input terminal based on the third control signal,
wherein the seventh switch is turned on when any one of the third reference voltage and the fourth reference voltage is applied to the second resistor and is turned off when both the third reference voltage and the fourth reference voltage are not applied to the second resistor.

12. The semiconductor device of claim 11, further comprising a fourth switch configured to control connection between the first resistor and the second resistor based on a fourth control signal, wherein the fourth control signal is a signal obtained by inverting the third control signal.

13. A semiconductor device comprising:
- an integrator configured to receive a first input signal through a first input terminal and output a corresponding first output signal, and to receive a second input signal through a second input terminal and output a corresponding second output signal;
- a quantizer configured to generate a first digital signal based on the first and second output signals;
- a first switch configured to control application of a first reference voltage to a first resistor based on a first control signal;
- a second switch configured to control application of a second reference voltage to the first resistor based on a second control signal;
- a third switch configured to control connection between the first resistor and the first input terminal based on a third control signal; and
- a fourth switch configured to control connection between the first input terminal and the second input terminal based on a fourth control signal,
- wherein the first through fourth control signals are generated based on the first digital signal and a second digital signal obtained by delaying the first digital signal.

14. The semiconductor device of claim 13, further comprising:
- a fifth switch configured to control application of a third reference voltage to a second resistor based on the second control signal;
- a sixth switch configured to control application of a fourth reference voltage to the second resistor based on the first control signal; and
- a seventh switch configured to control connection between the second resistor and the second input terminal based on the third control signal.

15. The semiconductor device of claim 13, further comprising a control signal generator configured to generate the first through fourth control signals, wherein the control signal generator comprises a first logic gate outputting the third control signal by performing an XNOR computation on the first digital signal and the second digital signal and an inverter outputting the fourth control signal by inverting the third control signal.

16. The semiconductor device of claim 15, wherein the control signal generator further comprises a second logic gate outputting the second control signal by performing an AND computation on the first digital signal and the second digital signal.

17. The semiconductor device of claim 16, wherein the control signal generator further comprises a third logic gate outputting the first control signal by performing a NOR computation on the first digital signal and the second digital signal.

18. A semiconductor device comprising:
- an integrator configured to receive a first input signal through a first input terminal and output a corresponding first output signal, and to receive a second input signal through a second input terminal and output a corresponding second output signal;
- a quantizer configured to generate a first digital signal based on the first and second output signals;
- a feedback circuit configured to provide any one of a first reference voltage and a second reference voltage to the first input terminal based on a control signal generated based on the first digital signal and a second digital signal obtained by delaying the first digital signal and provide any one of a third reference voltage and a fourth reference voltage to the second input terminal based on the control signal;
- a first switch configured to control connection between the feedback circuit and the first input terminal; and
- a second switch configured to control connection between the feedback circuit and the second input terminal.

19. The semiconductor device of claim 18, wherein the feedback circuit further comprises a third switch controlling connection between the first input terminal and the second input terminal based on the control signal.

20. The semiconductor device of claim 18, wherein the feedback circuit comprises a first resistor and a third switch applying any one of the first reference voltage and the second reference voltage to the first resistor when the first digital signal and the second digital signal obtained by delaying the first digital signal have the same value and not applying both the first reference voltage and the second reference voltage to the first resistor when the first digital signal and the second digital signal obtained by delaying the first digital signal have different values, and the first switch controls connection between the first resistor and the first input terminal.

* * * * *